United States Patent
Winzer et al.

[11] Patent Number: 6,166,548
[45] Date of Patent: Dec. 26, 2000

[54] METHOD OF DETECTING BATTERY CAPACITY IN A ZINC-AIR BATTERY

[75] Inventors: Jochen Winzer, Hamden; Bill Kurple, Middlebury, both of Conn.

[73] Assignee: Timex Corporation, Middlebury, Conn.

[21] Appl. No.: 09/159,719

[22] Filed: Sep. 24, 1998

[51] Int. Cl.[7] .......................... G01N 27/416; G01R 31/36
[52] U.S. Cl. ............................................ 324/433; 324/429
[58] Field of Search .................................. 324/426, 429, 324/433

[56] References Cited

U.S. PATENT DOCUMENTS

| | | | |
|---|---|---|---|
| 4,258,999 | 3/1981 | Tominaga | 324/433 X |
| 4,321,541 | 3/1982 | Nishizuka | 324/426 |
| 4,355,277 | 10/1982 | Davis et al. | 323/351 |
| 5,111,148 | 5/1992 | Senoo et al. | 324/433 |
| 5,182,583 | 1/1993 | Horigome et al. | 324/429 X |
| 5,191,291 | 3/1993 | Taylor | 324/429 |
| 5,773,977 | 6/1998 | Dougherty | 324/429 |

*Primary Examiner*—Glenn W. Brown
*Attorney, Agent, or Firm*—Carmody & Torrance LLP

[57] ABSTRACT

A method of detecting battery capacity in a zinc-air battery. The method includes the steps of removing all non-essential loads from the battery for a first period of time, thereafter and for a second period of time, applying a constant load to the battery, periodically sampling the voltage of the battery, and, as a function thereof, determining whether a condition is satisfied during the second period of time, the satisfying of the condition indicating low battery capacity. The method of detecting battery capacity can also determine battery usage on a real-time basis in which an accumulator is loaded with a value representing an expected zinc-air battery capacity, loads on the battery are detected, and the accumulator is decremented based on the detected actual usage. The accumulator reaching a minimum value indicates that the battery capacity is low.

10 Claims, 4 Drawing Sheets

METHOD OF DETECTING BATTERY CAPACITY IN A ZINC-AIR BATTERY

BACKGROUND OF THE INVENTION

The present invention relates generally to zinc-air batteries, and in particular, to a method of detecting the battery capacity in a zinc-air battery.

Zinc-air batteries are typically used to power small instruments, such as hearing-aid devices. Other small electronic instruments or devices, such as pagers or combination pager/watches utilize zinc-air batteries for power as well. In one preferred application, the zinc-air cell is placed in a sealed battery compartment. Oxygen used by the zinc-air cell to produce power is provided through a tiny air hole in the battery chamber. An example of this arrangement can be seen in U.S. application Ser. No. 08/834,133, entitled "Container for Electrical Device Utilizing a Metal Air Cell," which itself is assigned to the present assignee and incorporated by reference as if fully set forth herein.

However, zinc-air batteries in pagers require varying loads to be placed thereon since the operation of the various components like the RF receiver, the signal processor, the microcontroller or the transducer require varying amounts of current. Thus, in a pager, current draw varies which in turn causes fluctuations in the battery voltage. Unfortunately, and as will now be described, battery voltage itself is not a valid indication of the capacity left in the cell.

For example, reference is briefly made to FIG. 1 which illustrates typical zinc-air discharge curves for three different load conditions (1.0 mA, 1.5 mA and 2.0 mA). Each of the curves' characteristics demonstrate that zinc-air batteries maintain, for essentially their entire life, an extremely constant voltage. However, as the battery life comes to an end, there is a significant and dramatic fall-off of the battery voltage. Section 101 of each respective curve illustrates the voltage level that can be maintained by the respective batteries during their life, while section 102 of each curve illustrates the dramatic fall-off at the batteries' end of life.

Additionally, FIG. 2 which also illustrates typical zinc-air load curves, demonstrates that the zinc-air battery's voltage is highly dependent on the load placed thereon. In particular, FIG. 2 illustrates a typical voltage/current profile of a good battery 201 during the time in region 101 of FIG. 1 while battery 202 is illustrated near its end of life, and in particular, nearer portion 102 of the curves of FIG. 1.

Accordingly, a method of battery capacity detection that better alerts a user when a battery is near its end life so that replacement can be effectuated prior to the device being inoperable and that achieves the below mentioned objectives is desired.

SUMMARY OF THE INVENTION

Generally speaking, in accordance with the present invention, a method of detecting battery capacity in a zinc-air battery is provided. In accordance with a preferred embodiment, the method comprises the steps of removing all non-essential loads from the battery for a first period of time, thereafter, and for a second period of time, applying a constant load to the battery, periodically sampling the voltage of the battery, and, as a function thereof, determining whether a condition is satisfied during the second period of time, the satisfying of the condition indicating low battery capacity.

In accordance with another preferred embodiment, the method for detecting battery capacity in a zinc-air battery comprises the steps of loading an accumulator with a value representing an expected zinc-air battery capacity, determining at a plurality of selected time intervals whether identified loads are placed on the battery, subtracting predefined values from the accumulator at each selected time interval if an identified load is placed on the battery, and determining if the accumulator has reached a minimum value, the reaching of the minimum value indicating the condition of low battery capacity in the battery.

Accordingly, it is an object of the present invention to provide a method of detecting the battery capacity in a zinc-air cell.

Another object of the present invention is to provide an improved method of tracking battery usage by monitoring battery load in real-time.

Another object of the present invention is to provide an improved method of detecting when a zinc-air battery is near its end of life.

Still other objects and advantages of the invention will in part be obvious and will in part be apparent from the specification.

The invention accordingly comprises the features of construction and sequence of steps which will be exemplified in the construction and processes hereinafter set forth, and the scope of the invention will be indicated in the claims.

BRIEF DESCRIPTION OF THE DRAWINGS

For a fuller understanding of the invention, reference is made to the following description taken in connection with the accompanying drawings, in which.

DETAILED DESCRIPTION OF THE PREFERRED EMBODIMENTS

Figure 3:
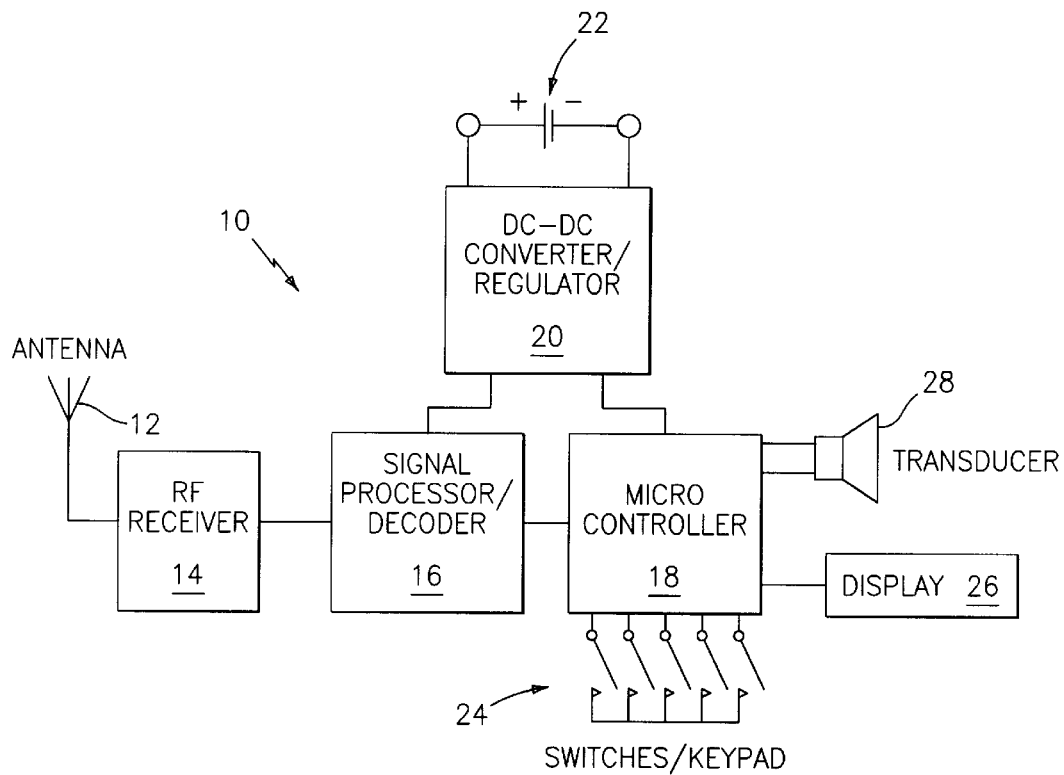
FIG. 3 is a simplified block diagram of a pager/watch constructed in accordance with the present invention, the pager/watch utilizing a zinc-air battery.

Reference is now made to FIG. 3, which represents a simplified functional block diagram for a device 10, preferably a pager/watch, constructed in accordance with the present invention. As the present invention is applicable to any small electronic device that utilizes a zinc-air battery and that has a microprocessor constructed to carry out the following method, the references herein to a combination pager/watch is made by way of example and not limitation.

In a preferred embodiment, an antenna 12 is coupled to an RF receiver 14. Receiver 14 receives incoming signals such as pager messages in a manner well understood by one of skill in the art. The output of RF receiver 14 is coupled to the input of a signal processor/decoder 16 in a manner as also would be understood in the art. A microcontroller 18 which controls the processing of information and carries out the processes disclosed herein, is coupled to the output of decoder 16. A DC-DC converter/regulator 20 such as the converter described in U.S. Pat. No. 4,355,277, which is incorporated by reference as if fully set forth herein, is coupled both to decoder 16 and microcontroller 18. Converter 20 generates the power levels required for the microcontroller and decoder. Signal lines are provided between regulator 20 and microcontroller 18 to allow regulator 20 to provide the status of battery voltage to microcontroller 18. A battery 22 which in accordance with the present invention is a zinc-air battery is connected to regulator 20. A plurality of keypad switches 24 for controlling the functionality of device 10 in a well known manner are coupled to microcontroller 18. A display 26 (preferably an LCD display) with optional backlighting capabilities, is also coupled to the output of microcontroller 18. A transducer 28 for emitting sounds, such as melodies, alarms or the like, is also coupled to microprocessor 18.

Figure 4:
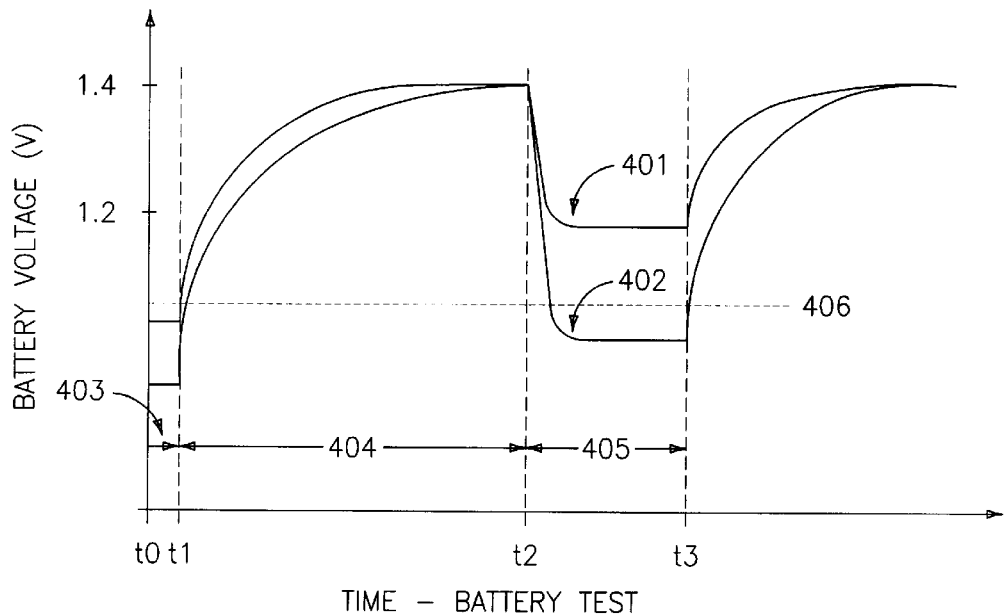
FIG. 4 is a graph illustrating battery voltage curves for known zinc-air batteries under loaded and unloaded conditions.

Reference is now briefly made to FIG. 4 which illustrates discharge curves for two (2) zinc-air batteries (one indicated by curve 401 and the other indicated by curve 402) under load conditions and non-load conditions.

Generally speaking, an objective of the present invention is to detect voltage levels of a zinc-air battery under known load conditions. Prior to loading the battery, however, it is essential that the battery be permitted to "rest" so as to allow the battery to recover to its maximum voltage. As seen in FIG. 4, it is assumed that prior to commencing the process in accordance with the present invention, the zinc-air batteries may be subjected to unknown load conditions. Such loading is taking place in time period 403 between t0–t1. As will be discussed in further detail below, during time period 404 between t1–t2 all load conditions are removed from each zinc-air battery and each zinc-air battery is in a "rest" condition in which there is no load place thereon. As can be seen, each zinc-air battery is permitted to recover to its maximum voltage (about 1.4V). Time period 405 between t2–t3 illustrates the voltage of the two exemplary zinc-air batteries with controlled loads placed thereon. As will be discussed below, during the time when a controlled load is placed on the battery represented by curve 402, the voltage remains below a predefined threshold (dotted line 406). The battery represented by curve 401 remains above the threshold 406. The importance thereof will be discussed below.

Figure 5:
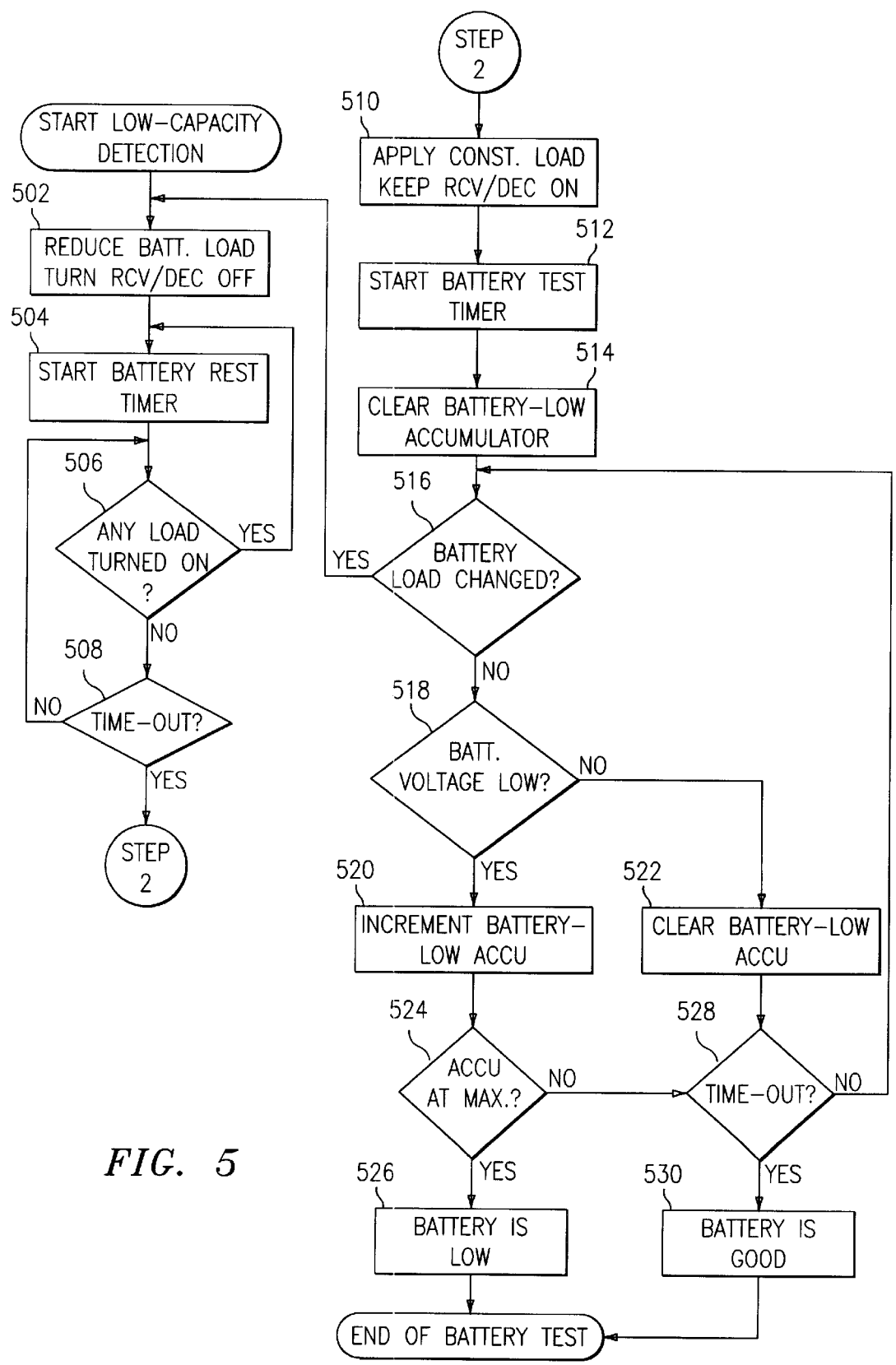
FIG. 5 is a flowchart illustrating a preferred method of detecting the voltage capacity of a zinc-air battery in accordance with the present invention.

Reference is now made to FIG. 5 which illustrates the preferred method of detection of the battery voltage level in a zinc-air battery, such as battery 22. The preferred method is a two-step process consisting of a sequence of steps to carry out a battery "rest period" and a sequence of steps to carry out a battery "test period".

In the first phase of the method, the battery is placed in a no-load condition for a predetermined period of time, selected to be about 8 minutes. Such time period is preferably empirically determined based on factors described in the aforementioned application Ser. No. 08/834,133. This procedure permits the battery to recover from any previous high-load conditions such as that existing during time period 403 (FIG. 4). During time period 404 the battery voltage will increase.

To eliminate, or at least reduce the load on battery 22, receiver 14 and decoder 16 are temporarily turned-off (step 502) and a battery rest timer in microcontroller 18 is started (step 504). While the timer is running, if microcontroller 18 detects any other consumption of power in device 10 (step 506) the timer is restarted. If, throughout the predetermined rest period, no other power is consumed, the method continues onto step 2 (step 508). Otherwise, the timer is restarted. This may occur for example, if a programmed alarm goes off or the user presses a button since these events will load down the battery.

Alternatively, it is contemplated that the system could enforce the rest period by shutting down all peripherals and functionality of the device. This would be less than optimal however, since not allowing any power consumption to take place could violate system integrity in the event that an alarm would have otherwise been activated or important keypad entries would otherwise have been ignored.

Figure 2:
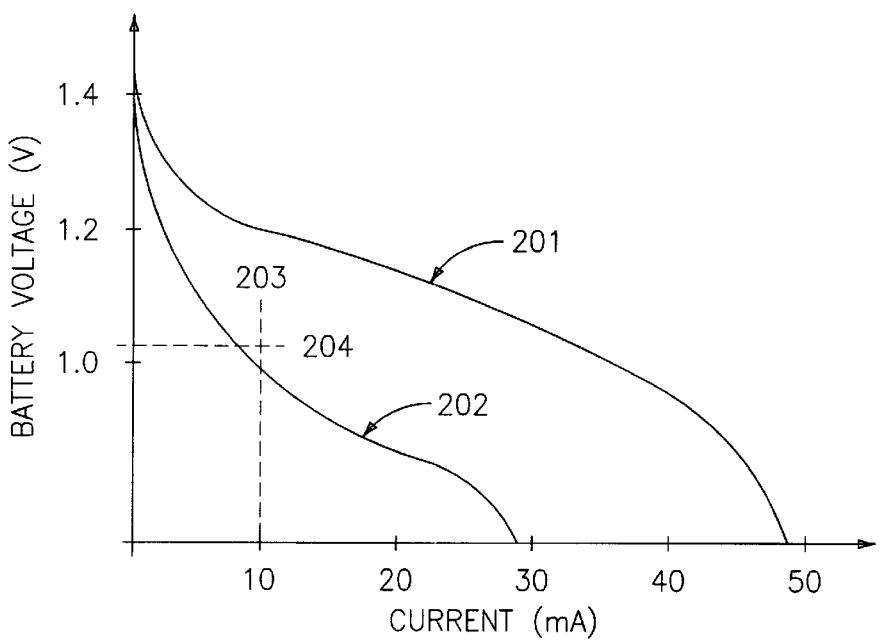
FIG. 2 is a zinc-air voltammogram for both a "good" cell and a 90% discharged cell.

The purpose of step 2 of the disclosed method is to check the battery voltage under a defined load to determine whether the battery can maintain a threshold voltage for a predetermined period of time. FIG. 2 illustrates an example wherein battery 202 cannot maintain a threshold voltage of 1.05V at an output current of 10 mA while battery 201 is able to maintain an output voltage of about 1.2V at the same output current. A battery that is "good" will have a voltage level above the threshold voltage level (battery 201) and a battery at its end of life (battery 202) will have a voltage level below the threshold voltage.

Accordingly, microcontroller 18 first applies a constant load (step 510) to battery 22. The constant load may be achieved by maintaining receiver 14 and decoder 16 in an "on" condition. This should be contrasted to the receiver's and decoder's normal operation which may require only periodic activation in accordance with the applicable pager protocol. A timer initially set to a preferable 4 minutes, is then started (step 512) and an accumulator is cleared (step 514). While the timer is running, microcontroller 18 is again monitoring all peripheral and functionality of the device to ensure that the load applied in step 510 remains constant (step 516). Any additional load detected (i.e. an alarm sounds or a key on keypad 24 is depressed) would destroy the integrity of the test, and the entire test sequence, beginning at step 502, would need to be repeated.

During the battery test, which is indicated by time period 405 (FIG. 4) voltage samples are taken preferably in intervals of 1 second. Whenever a sample is above the threshold voltage (step 518), a battery-low accumulator is cleared (step 522). If the sample is below the threshold, the battery-low accumulator is incremented (step 520). The battery test stops when either the timer times out (step 528) or the battery-low accumulator reaches a predefined maximum (step 524). This maximum value may be such as 30, with the recognition that it is desirable to ensure that the voltage, if low, remains low for at least 30 seconds. This would be consistent with the voltage detection taking place essentially every second. The timing out of the timer indicates that the battery is still good (step 530). If the accumulator reaches its maximum value, the voltage has stayed below the threshold voltage for a defined time (i.e. 30 seconds) (see battery 402 during time period 405 in FIG. 4) and therefore, the battery is determined to be nearing its end of life (step 526). If desired, the user could be notified that the battery needs replacement by an alarm alert or a message display.

In the preferred embodiment, the aforementioned routine should be periodically executed, for example, once a day. Alternatively, it could be executed after a battery change to warn the user in case he mistakenly installed a "bad" battery.

Figure 1:
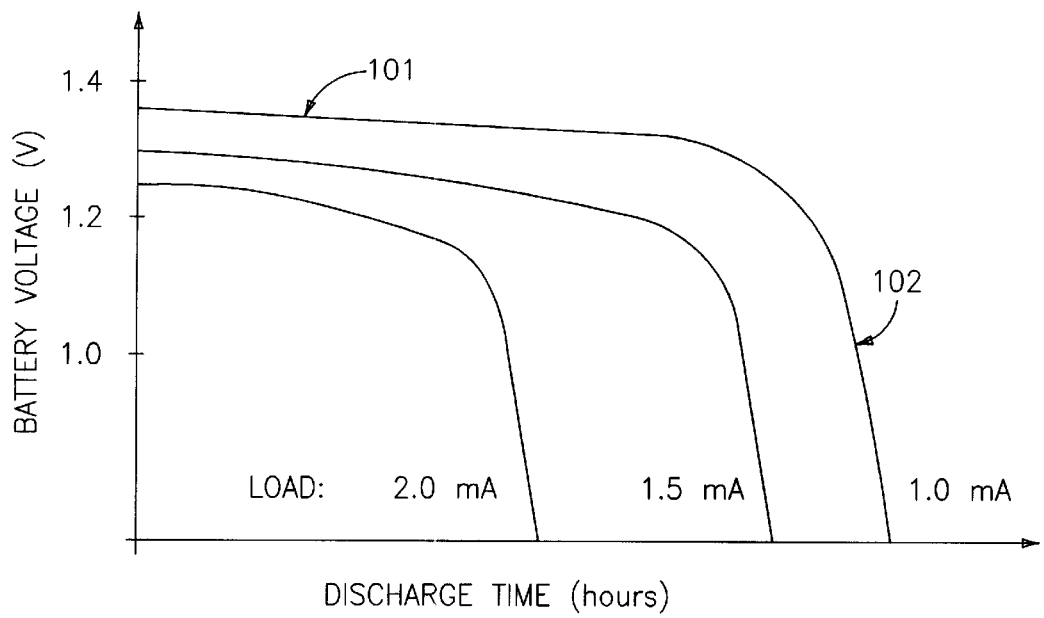
FIG. 1 is a graph illustrating typical discharge curves for known zinc-air batteries under different load conditions.
Figure 6:
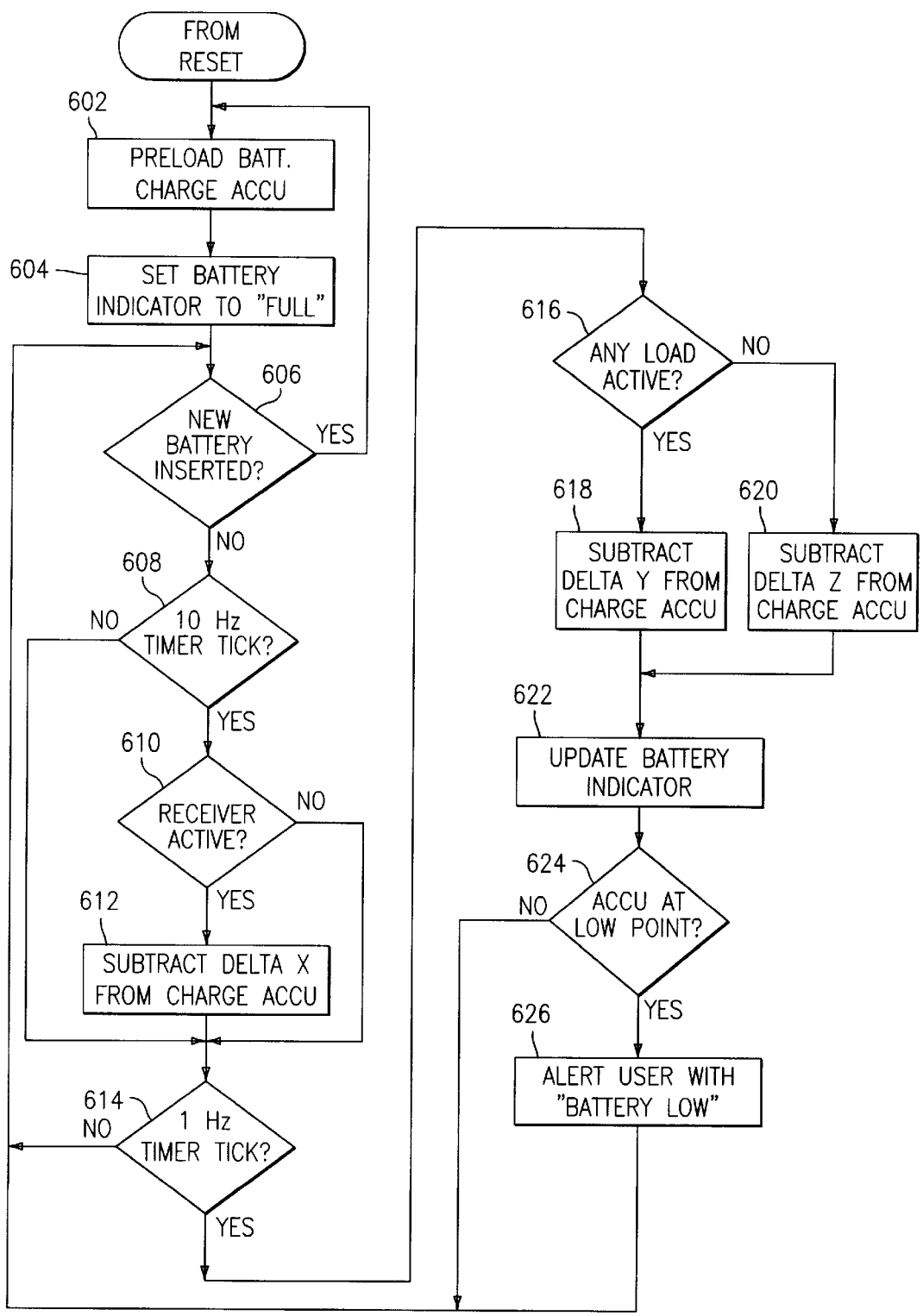
FIG. 6 is a flowchart illustrating a preferred method of detecting usage of a zinc-air battery in accordance with the present invention.

While the preceding process is extremely advantageous in ensuring that a battery at the end of its life is replaced, the one short-coming recognized by the inventors hereof is that it does not give the user any indication of how much energy capacity is left in the zinc-air battery at any time. The aforementioned battery load test cannot provide this information since the voltage level of the zinc-air cell stays relatively constant during discharge (see FIG. 1) Accordingly, a supplemental process that tracks battery usage by monitoring battery load in real-time is desirable. The process illustrated in FIG. 6 achieves this objective.

In particular, a battery charge accumulator is utilized to reflect the amount of energy left in the zinc-air cell. The accumulator can be implemented as a software counter in microcontroller 18 with a preferable resolution of about 1/5 (mA)(sec), although other resolutions are within the scope of the invention. The accumulator is preloaded with the battery capacity value of a new cell upon system reset (step 602). For example, a known 675 zinc-air type cell has a capacity of 600 (mA) (hours). Accordingly, the accumulator would be loaded with (5)(600 mA) (3,600 sec)=10,800,000 units, with each unit representing 1/5 (mA)(sec). For such a value, a 16-bit counter would be sufficient. Display 26 can also provide indication that the battery is full (step 604).

The microcontroller keeps track of battery changes (step 606), so that whenever the battery is replaced with a new fully-charged cell, the battery charge counter is reloaded with the battery-full value and the indicator is reset (steps 602–604).

Receiver/decoder activity is preferably monitored every 1/10 second (step 608). If the receiver is currently active (step 610), a predetermined amount of units (ΔX) are subtracted from the accumulator to account for the receiver/decoder current being drawn from the battery (step 612) (If, for example, the receiver/decoder current is 10 mA, (5)(10 mA)(0.1 sec)=5 units are subtracted from the accumulator.).

A 1 Hz timer is used to monitor all other system components that draw current from the battery when they are active (step 614). For a pager, current consumption is increased for example whenever transducer 28 is active, the backlight of display 26 is on or when microcontroller 18 is in a "fast" mode (its PLL is on to increase bus speed). The microcontroller monitors these conditions every second (step 616), and if any other components are active, a Δy is subtracted from the accumulator to account for the current draw (step 618). If the system is otherwise "quiet", a Δz is subtracted to account for system standby current (step 620). For example, in the "fast" mode, the current draw by microcontroller 18 is 3 mA. This corresponds to a Δy of (5) (3 mA)(1 sec)=15 units. If overall standby current in the "quiet" mode is 200 µA, Δz=(5)(0.2 mA)(1 sec)=1 unit.

The battery charge indicator may be updated every second with the latest accumulator value and a simplified illustration representative thereof may be provided to the user in a known manner indicating such battery level (step 622). When the accumulator reaches a predefined low point (step 624), for example 60 mAh or 10% of battery capacity (i.e. 1,080,000 units), the user can be alerted with a "low battery" indication (step 626) indicating a need for a battery change.

Accordingly, it can be appreciated that the method in accordance with the present invention permits a user to more accurately determine when a zinc-air battery is nearing or is at its end of life. Additionally, on an quantitative basis, the present invention allows a user to more precisely determine the amount of battery capacity remaining in the zinc-air cell.

It will thus be seen that the objects set forth above, among those made apparent from the preceding description, are efficiently attained and, since certain changes may be made in the above methodology without departing from the spirit and scope of the invention, it is intended that all matter contained in the above description or shown in the accompanying drawings shall be interpreted as illustrative and not in a limiting sense. For example, the duration of the timers are one of design choice and can be variably set while still remaining within the scope of the invention. Also, the setting of the thresholds may vary slightly while remaining within the scope of the invention.

It is also to be understood that the following claims are intended to cover all of the generic and specific features of the invention described herein and all statements of the scope of the invention which as a matter of language might fall therebetween.

We claim:

1. A method of detecting battery capacity in a zinc-air battery, the method comprising the steps of:

removing all non-essential loads from the battery for a first period of time;

thereafter and for a second period of time, applying a constant load to the battery;

periodically sampling the voltage of the battery; and, as a function thereof determining whether a condition is satisfied during the second period of time by the steps of:

incrementing a counter each time the sampled voltage is below a threshold value and clearing the counter each time the sampled voltage is at least at the threshold value and determining at the end of the second period of time whether the counter has reached a maximum value;

whereby the reaching of the maximum value prior to the end of the second period indicates a low battery capacity.

2. The method as claimed in claim 1, including the step of clearing the counter prior to initially sampling the voltage of the battery.

3. A device including a microcontroller having means to carry out the method as claimed in claim 1, wherein the device has means for at least one of generating and displaying time information and receiving transmitted coded messages.

4. A method of detecting battery capacity in a zinc-air battery, the method comprising the steps of:

loading an accumulator with a value representing an expected zinc-air battery capacity;

determining at a plurality of selected time intervals whether identified loads are placed on the battery;

subtracting predefined values from the accumulator at each selected time interval if an identified load is placed on the battery; and determining if the accumulator has reached a minimum value, the reaching of the minimum value indicating the condition of low battery capacity in the battery.

5. The method as claimed in claim 4, wherein a first time interval is 0.1 seconds and a first identified load is the combination of a receiver and a decoder, wherein every 0.1 seconds it is determined whether the first identified load is placed on the battery and if so, the accumulator value is reduced by a first predetermined value.

6. The method as claimed in claim 5, wherein a second time interval is one second and a second identified load is a load other than the receiver and the decoder, wherein every one second it is determined whether the second identified load is placed on the battery and if so, the accumulator value is reduced by a second predetermined value.

7. The method as claimed in claim 6, wherein when no load is placed on the battery, the accumulator is reduced by a third predetermined value each second time interval.

8. The method as claimed in claim 4, including alerting a user when the accumulator has reached the minimum value.

9. A device including a microcontroller having means to carry out the method as claimed in claim 4, wherein the device has means for at least one of generating and displaying time information and receiving transmitted coded messages.

10. A method of detecting battery capacity in a zinc-air battery, the method comprising the steps of:

loading an accumulator with a value representative of the battery capacity of a new zinc-air battery;

determining during first time intervals whether a first load is placed on the battery and subtracting a first predefined value from the accumulator if the first load has been placed on the battery;

determining during second time intervals whether a second load is placed on the battery and subtracting a second predefined value from the accumulator if the second load has been placed on the battery and subtracting a third predefined value from the accumulator if the second load has not been placed on the battery; and determining if the accumulator has reached a minimum value, the reaching of the minimum value indicating the condition of low battery capacity in the battery.

* * * * *